United States Patent
Yang et al.

(10) Patent No.: US 8,922,254 B2
(45) Date of Patent: Dec. 30, 2014

(54) DRIVE CIRCUITRY COMPENSATED FOR MANUFACTURING AND ENVIRONMENTAL VARIATION

(71) Applicant: Macronix International Co., Ltd., Hsinchu (TW)

(72) Inventors: Shang-Chi Yang, Xihu Township (TW); Ken-Hui Chen, Hsinchu (TW); Su-Chueh Lo, Hsinchu (TW); Kuen-Long Chang, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/913,139

(22) Filed: Jun. 7, 2013

(65) Prior Publication Data

US 2014/0210522 A1    Jul. 31, 2014

Related U.S. Application Data

(60) Provisional application No. 61/757,732, filed on Jan. 29, 2013.

(51) Int. Cl.
| | |
|---|---|
| H03B 1/00 | (2006.01) |
| H03K 3/00 | (2006.01) |
| H03K 17/14 | (2006.01) |

(52) U.S. Cl.
CPC ................. *H03K 17/145* (2013.01)
USPC ......................................... 327/108; 327/112

(58) Field of Classification Search
CPC .............. H03K 19/00361; H03K 19/00315; H03K 19/00384; H04L 25/028; H04L 25/0272
USPC ................................................ 327/108–112
See application file for complete search history.

(56) References Cited

U.S. PATENT DOCUMENTS

| | | |
|---|---|---|
| 4,234,920 A | 11/1980 | Van Ness et al. |
| 4,584,494 A | 4/1986 | Arakawa et al. |
| 5,047,659 A | 9/1991 | Ullrich |
| 5,155,379 A | 10/1992 | Narahara |
| 5,498,987 A | 3/1996 | Nelson |
| 6,078,168 A | 6/2000 | Paolo |
| 7,075,353 B1 | 7/2006 | Wan et al. |
| 7,138,841 B1 | 11/2006 | Li et al. |
| 7,142,005 B1 | 11/2006 | Gaboury |
| 7,459,952 B2 | 12/2008 | Ogita |
| 7,482,759 B2 * | 1/2009 | Yoneyama et al. ......... 315/169.1 |
| 7,521,975 B2 * | 4/2009 | Biesterfeldt et al. .......... 327/170 |
| 7,940,549 B2 | 5/2011 | Stembridge et al. |
| 7,961,027 B1 | 6/2011 | Chen et al. |
| 8,060,771 B2 | 11/2011 | Tyrrell |
| 8,314,757 B2 * | 11/2012 | Osaka ........................... 345/82 |
| 8,736,331 B2 | 5/2014 | Chen |
| 2001/0026177 A1 * | 10/2001 | Iliasevitch .................... 327/109 |
| 2005/0156836 A1 * | 7/2005 | Yoneyama et al. ............. 345/76 |
| 2007/0274138 A1 | 11/2007 | Ogiwara et al. |
| 2008/0158760 A1 * | 7/2008 | Moyer et al. ................. 361/93.1 |
| 2008/0297234 A1 * | 12/2008 | Moholt et al. ................ 327/541 |
| 2008/0309383 A1 | 12/2008 | Yada et al. |
| 2009/0009003 A1 | 1/2009 | Roth et al. |

(Continued)

*Primary Examiner* — Adam Houston (74) *Attorney, Agent, or Firm* — Kenta Suzue; Haynes Beffel & Wolfeld LLP (57) ABSTRACT

Current drivers and biasing circuitry at least partly compensate for manufacturing variations and environmental variations such as supply voltage, temperature, and fabrication process.

20 Claims, 8 Drawing Sheets

(56) References Cited

U.S. PATENT DOCUMENTS

| | | | |
|---|---|---|---|
| 2009/0140777 A1* | 6/2009 | Morisson | 327/108 |
| 2009/0224829 A1* | 9/2009 | Johansson | 330/252 |
| 2009/0243708 A1* | 10/2009 | Marinca | 327/539 |
| 2010/0007428 A1 | 1/2010 | Nezuka | |
| 2010/0289548 A1 | 11/2010 | Cheng | |
| 2011/0181256 A1* | 7/2011 | Ulbrich et al. | 323/274 |
| 2011/0181630 A1* | 7/2011 | Smith et al. | 345/690 |
| 2014/0032799 A1* | 1/2014 | Dickson et al. | 710/104 |
| 2014/0043892 A1* | 2/2014 | Lee et al. | 365/158 |
| 2014/0103965 A1* | 4/2014 | Wang et al. | 327/108 |
| 2014/0210522 A1* | 7/2014 | Yang et al. | 327/109 |

* cited by examiner

$$PBIAS = V_{DD} - I_{ref} \times R - I_{ref} \times R_{MP} = V_{DD} - V_{BGREF}(1 + \frac{R_{MP}}{R})$$
$$NBIAS = I_{ref} \times R + I_{ref} \times R_{MN} = V_{BGREF}(1 + \frac{R_{MN}}{R})$$

DRIVE CIRCUITRY COMPENSATED FOR MANUFACTURING AND ENVIRONMENTAL VARIATION

RELATED APPLICATIONS

The present application claims the benefit of U.S. Provisional Application No. 61/757,732 filed Jan. 29, 2013.

BACKGROUND

Manufacturing variations and environmental variations result in nonuniform current output from current drivers on different integrated circuits, despite sharing a common design. It would be desirable to have constant current outputs that remain uniform, despite such variations in manufacturing and environment. Unfortunately, it is challenging to design and make current drivers and biasing circuitry that can maintain uniform current output in the face of such variations.

SUMMARY

One aspect of the technology is an integrated circuit, including a first plurality of current drivers. The current drivers provide current outputs. The current drivers have a first set of variations with supply voltage, temperature, and fabrication process. The current outputs at least partly compensate each other for the first set of variations in supply voltage, temperature, and fabrication process.

In one embodiment, the first plurality of current drivers include a first current driver and a second current driver. The first current driver includes a first n-type transistor having a gate biased with a first supply reference voltage such as Vdd. The second current driver includes a second n-type transistor having a gate biased with a first voltage circuit output based on at least one constant voltage reference such as a bandgap reference or a battery. The current outputs of the first current driver and the second current driver at least partly compensate each other for the first set of variations of the current outputs.

In one embodiment, the first plurality of current drivers include a different first current driver and a different second current driver than described above. The first current driver includes a first p-type transistor having a gate biased with a first supply reference voltage such as ground. The second current driver includes a second p-type transistor having a gate biased with a first voltage circuit output based on at least one constant voltage reference. The current outputs of the first current driver and the second current driver at least partly compensate each other for the first set of variations of the current outputs.

Another embodiment of the circuit includes, in addition to the first plurality of current drivers having a first set of variations with supply voltage, temperature, and fabrication process, a second plurality of current drivers providing current outputs that are coupled together. The current outputs of the second plurality of current drivers have a second set of variations with supply voltage, temperature, and fabrication process. Different ones of the current outputs of the second plurality of current drivers at least partly compensate each other for the second set of variations of the current outputs. The first plurality of current drivers includes the set of n-type transistors described above, and the second plurality of current drivers includes the set of p-type transistors described above.

In one embodiment, the constant voltage reference is scaled proportionally with a resistance across source and drain terminals of a transistor. In another embodiment, the constant voltage reference includes at least one bandgap reference circuit. The ratio of the transistor resistance (transistor resistance=voltage across the transistor over the current through the transistor) to a constant resistance scales a bandgap voltage in a manner that varies with manufacturing process condition, supply voltage, and resistance.

In one embodiment with the first plurality of current drivers and the second plurality of current drivers, current mirrors make current copies of a current flowing through the bandgap reference circuit, and the constant voltage reference for the first plurality of current drivers and for the second plurality of current drivers are scaled proportionally with resistances across source and drain terminals of transistors.

Another aspect of the technology is an integrated circuit with a bias circuit. The bias circuit includes a first voltage circuit output based on at least one constant voltage reference. The first voltage circuit output biases at least one of a first plurality of current drivers as described herein.

In one embodiment the bias circuit further includes a second voltage circuit output based on at least one constant voltage reference. The second voltage circuit output biases at least one of a second plurality of current drivers as described herein.

Another aspect of the technology is a method, comprising:
generating current outputs from a first plurality of current drivers on an integrated circuit, the current outputs coupled together and having a first set of variations with supply voltage, temperature, and fabrication process, the current outputs at least partly compensating each other for the first set of variations in supply voltage, temperature, and fabrication process.

Yet another aspect of the technology is a method, comprising:
generating a first voltage circuit output on an integrated circuit, the first voltage circuit output based on at least one constant voltage reference, the first voltage circuit output biasing at least one of a first plurality of current drivers,
wherein the first plurality of current drivers provide current outputs coupled together and having a first set of variations with supply voltage, temperature, and fabrication process, and different ones of the current outputs at least partly compensate each other for the first set of variations of the current outputs.

DETAILED DESCRIPTION

Figure 1:
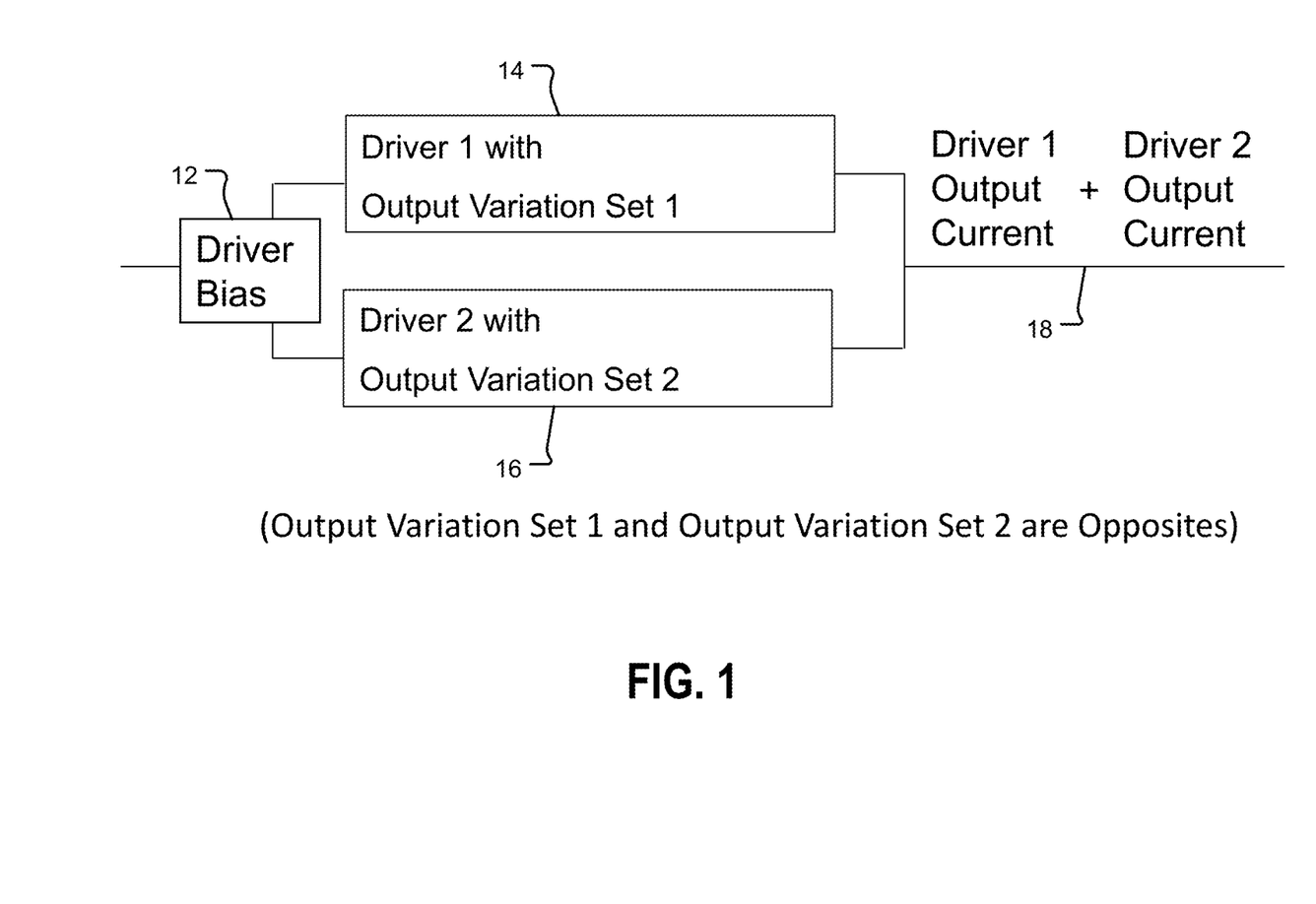
FIG. 1 is a block diagram of a circuit with multiple drivers that have different sets of output variations with manufacturing and environmental variations.

FIG. 1 is a block diagram of a circuit with multiple drivers that have different sets of output variations with manufacturing and environmental variations.

Figure 2:
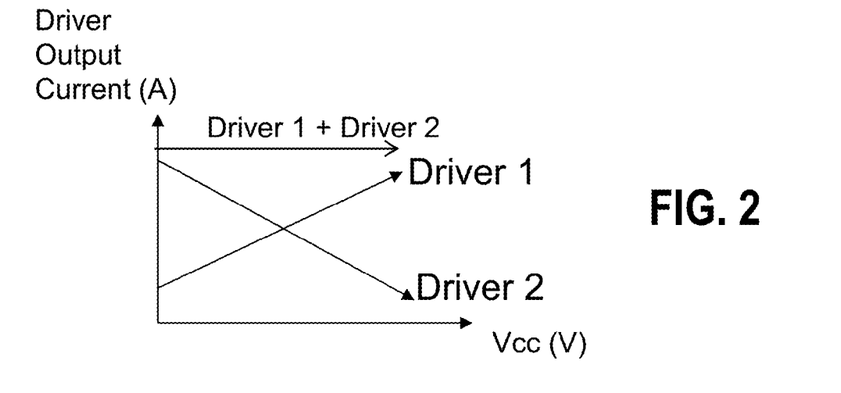
FIG. 2 is a simplified graph showing different drivers having output variations with supply voltage that compensate for each other, such that the combined driver output remains constant or substantially constant with varying supply voltage.
Figure 3:
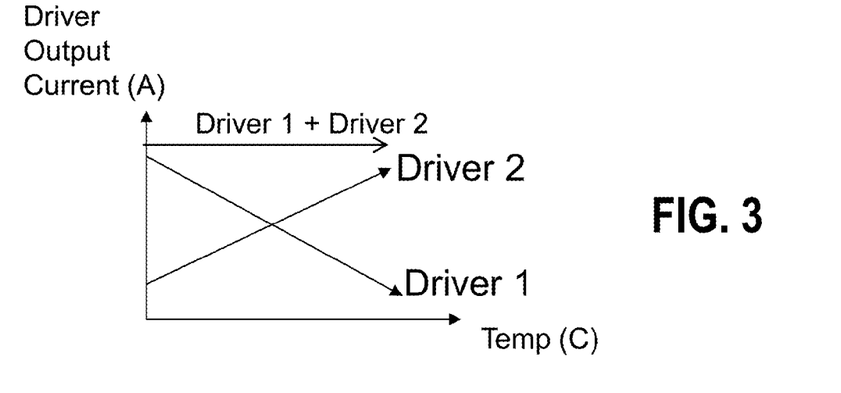
FIG. 3 is a simplified graph showing different drivers having output variations with temperature that compensate for each other, such that the combined driver output remains constant or substantially constant with varying temperature.
Figure 4:
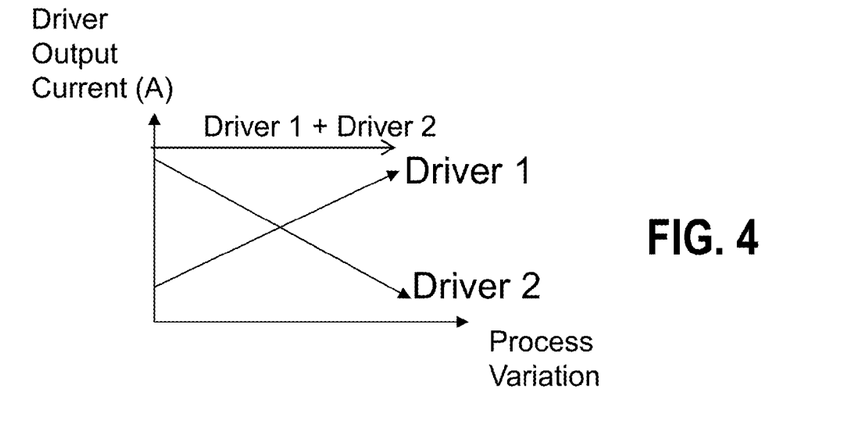
FIG. 4 is a simplified graph showing different drivers having output variations with manufacturing process that compensate for each other, such that the combined driver output remains constant or substantially constant with varying manufacturing process.

Driver bias 12 provides biasing signals such as voltages to driver 1 14 and driver 2 16. Driver 1 14 and driver 2 16 have opposite sets of output variations, respectively output variation set 1 and output variation 2. Examples of output variations are output currents that vary with process conditions during manufacturing of driver 1 14 and driver 2 16, and that vary with environmental conditions such as operating temperature of driver 1 14 and driver 2 16 and supply voltages of driver 1 14 and driver 2 16. FIGS. 2-4 provide further discussion of such output variations.

FIG. 2 is a simplified graph showing different drivers having output variations with supply voltage that compensate for each other, such that the combined driver output remains constant or substantially constant with varying supply voltage.

The output currents of driver 1 and driver 2 both vary with supply voltage Vcc. As Vcc rises, the output current of driver 1 increases, and the output current of driver 2 decreases. Accordingly, the output current variations of driver 1 and driver 2 compensate for each other, such that the total output current of driver 1 and driver 2 remains constant or substantially constant (e.g., 20 microvolts per volt or less) with varying supply voltage.

FIG. 3 is a simplified graph showing different drivers having output variations with temperature that compensate for each other, such that the combined driver output remains constant or substantially constant with varying temperature.

The output currents of driver 1 and driver 2 both vary with temperature. As temperature rises, the output current of driver 1 decreases, and the output current of driver 2 increases. Accordingly, the output current variations of driver 1 and driver 2 compensate for each other, such that the total output current of driver 1 and driver 2 remains constant or substantially constant with varying temperature (e.g., 0.048%/° C.). In one embodiment, the output current range is 500-540 microamperes from −40-125° C.

FIG. 4 is a simplified graph showing different drivers having output variations with manufacturing process that compensate for each other, such that the combined driver output remains constant or substantially constant with varying manufacturing process.

A fast manufacturing process condition results in drivers with driving current that is higher than designed. A slow manufacturing process condition results in drivers with driving current that is lower than designed.

The output currents of driver 1 and driver 2 both vary with temperature. As temperature rises, the output current of driver 1 decreases, and the output current of driver 2 increases. Accordingly, the output current variations of driver 1 and driver 2 compensate for each other, such that the total output current of driver 1 and driver 2 remains constant or substantially constant with varying manufacturing process (e.g., 0.048%/° C.). In one embodiment, the output current range is 500-540 microamperes from −40-125° C.

Figure 11:
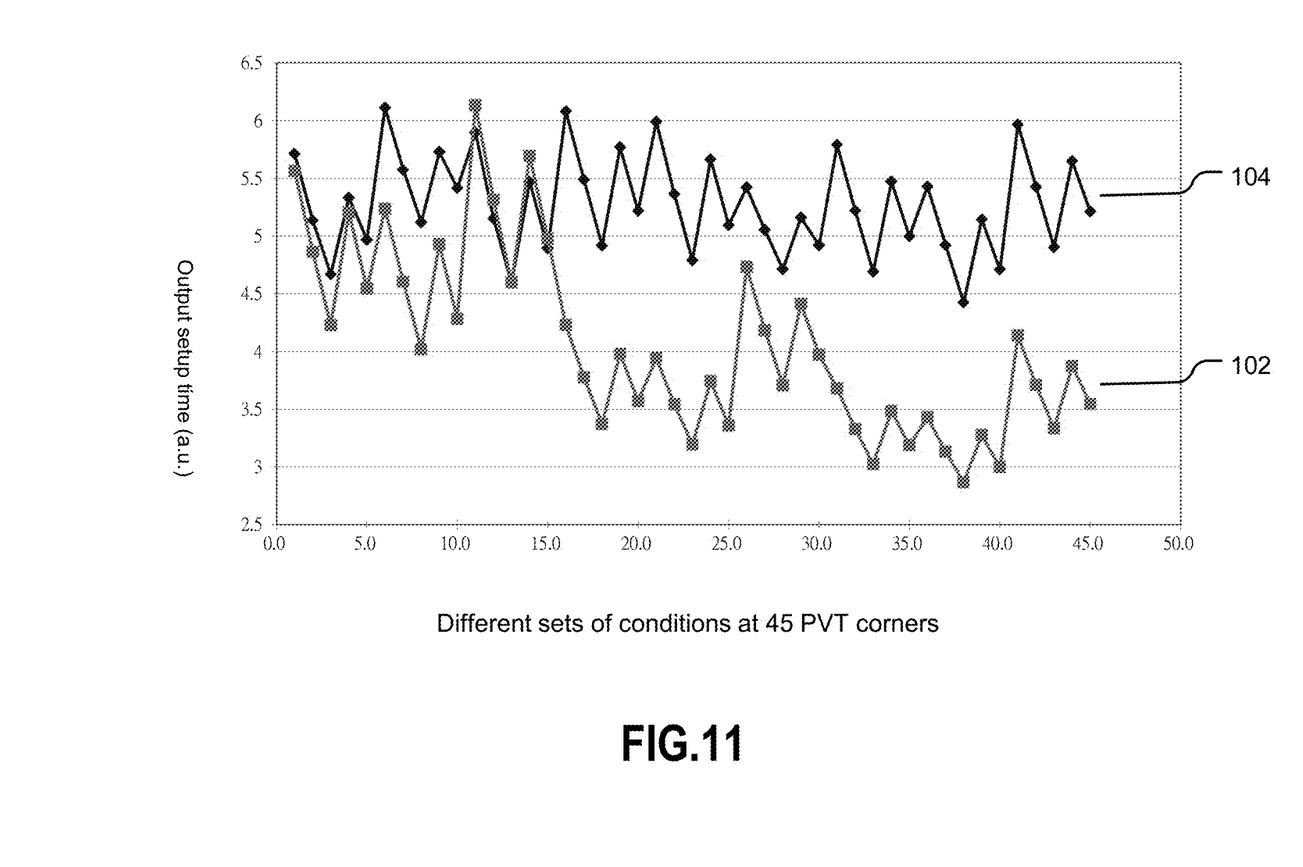
FIG. 11 a graph contrasting the relative uniformity of output setup time for a circuit with drivers that at least partly compensate for each other's output variations, and the relative nonuniformity of output setup time for a circuit with drivers that fail to compensate for each other's output variations

As shown by FIGS. 2-4 collectively, driver 1 and driver 2 both have output currents that vary with a set of variations, in this case supply voltage, temperature, and manufacturing process. Such variations of the output current with supply voltage, temperature, and manufacturing process of driver 1; and such variations of the output current with supply voltage, temperature, and manufacturing process of driver 2, compensate each other at least partly. As a result, the total output current of driver 1 and driver 2 remains constant or substantially constant despite variations of the output current with supply voltage, temperature, and manufacturing process of driver 1 and driver 2. Such embodiments demonstrate constant slew rate of dVoltage/dt at nodes that undergo charging or discharging. FIG. 11 provides further discussion of variations with manufacturing process, temperature, and supply voltage.

An example of driver 1 includes an n-type transistor, such as NMOS, with a VDD supply voltage at the gate. Another example of driver 1 includes a p-type transistor, such as PMOS, with a ground supply voltage at the gate.

Figure 7:
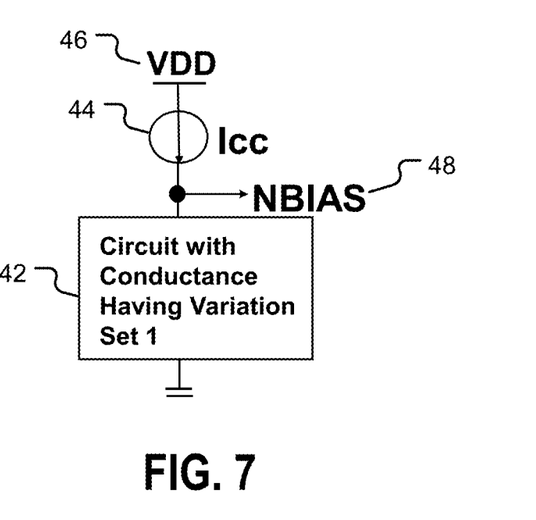
FIGS. 7 and 8 are circuit diagrams of parts of a bias circuit for different drivers that at least partly compensate for each other's output variations.
Figure 8:
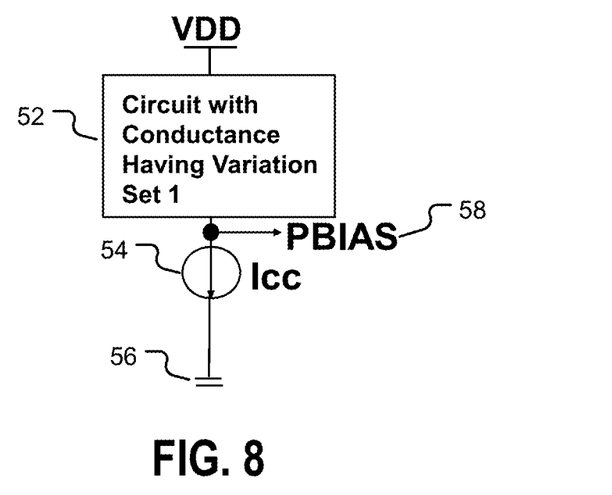
Figure 9:
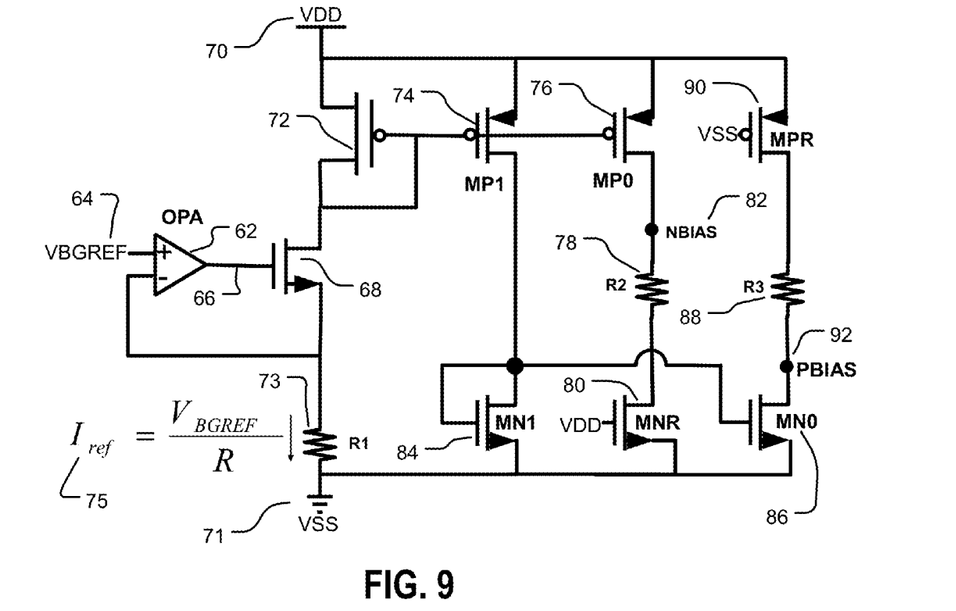
FIG. 9 is a circuit diagram of an example bias circuit that generates the biases for sets of different drivers that at least partly compensate for each other's output variations, including a bias for a set of drivers with n-type transistors, and another bias for a set of drivers with p-type transistors.

An example of driver 2 includes an n-type transistor, such as NMOS, with a bias of NBIAS at the gate. Another example of driver 2 includes a p-type transistor, such as PMOS, with a bias of PBIAS at the gate. FIGS. 7-9 provide further discussion of NBIAS and PBIAS.

Figure 5:
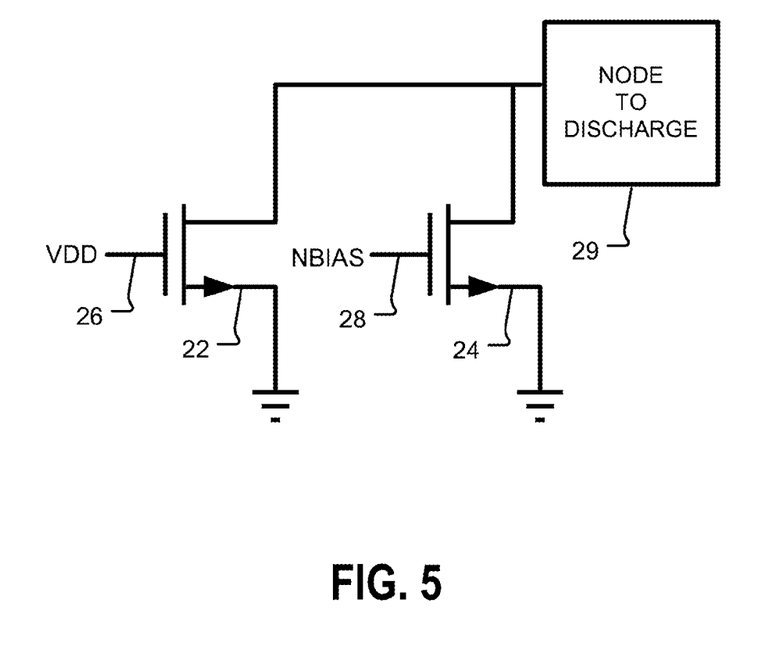
FIG. 5 is a circuit diagram with different drivers that at least partly compensate for each other's output variations, where the different drivers are n-type transistors.

FIG. 5 is a circuit diagram with different drivers that at least partly compensate for each other's output variations, where the different drivers are n-type transistors.

In FIG. 5, n-type transistors 22 and 24 are examples of driver 1 and driver 2 shown in FIG. 1. The n-type transistor driver 2 2 has a gate coupled to VDD 26, source coupled to ground, and drain coupled to a node to discharge 29. The n-type transistor driver 24 has a gate coupled to NBIAS 28, source coupled to ground, and drain coupled to a node to discharge 29. FIGS. 7 and 9 provide further discussion of NBIAS. The n-type transistor drivers 22 and 24 discharge node 29 to the ground reference voltage. The combined discharge current from node 29 with n-type transistor drivers 22 and 24 is constant or substantially constant with variations in supply voltage, temperature, and manufacturing process.

Figure 6:
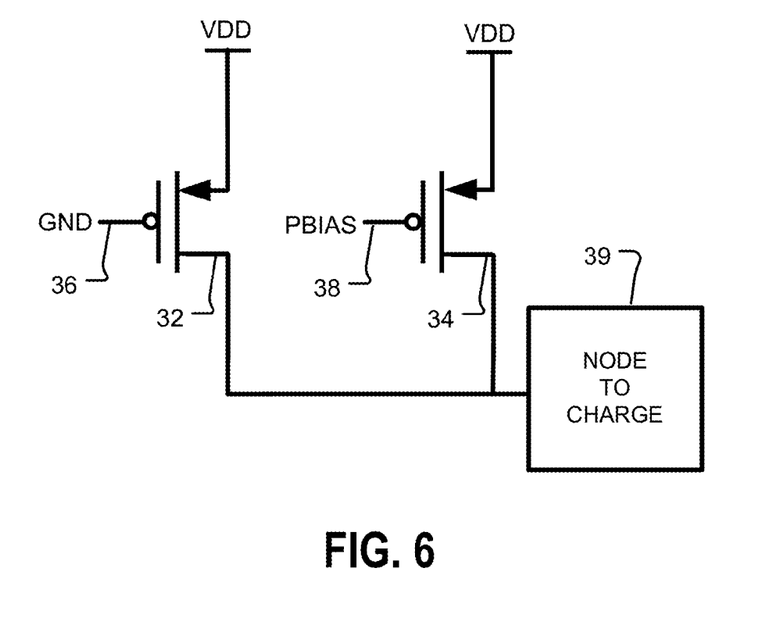
FIG. 6 is a circuit diagram with different drivers that at least partly compensate for each other's output variations, where the different drivers are p-type transistors.

FIG. 6 is a circuit diagram with different drivers that at least partly compensate for each other's output variations, where the different drivers are p-type transistors.

In FIG. 6, p-type transistors 32 and 34 are examples of driver 1 and driver 2 shown in FIG. 1. The p-type transistor driver 32 has a gate coupled to ground 36, drain coupled to a node to charge 39, and source coupled to Vdd. The p-type transistor driver 34 has a gate coupled to PBIAS 38, drain coupled to a node to charge 39, and source coupled to Vdd. FIGS. 8 and 9 provide further discussion of PBIAS. The p-type transistor drivers 32 and 34 charge node 39 to Vdd. The combined charge current to node 39 with p-type transistor drivers 32 and 34 is constant or substantially constant with variations in supply voltage, temperature, and manufacturing process.

FIGS. 7 and 8 are circuit diagrams of parts of a bias circuit for different drivers that at least partly compensate for each other's output variations.

FIG. 7 shows part of a circuit that generates NBIAS 48 for an instance of driver 2 discussed previously. In series, the circuit includes supply voltage VDD 46, current source Icc 44, node NBIAS 48, circuit 42 which has a conductance with variation set 1, and ground. Variation set 1 refers to the set of variations characterizing driver 1 in FIGS. 2-4, or variations of output current with supply voltage, temperature, and process variation. In another embodiment, a current source is coupled between node NBIAS 48 and ground, and a circuit is coupled between VDD 46 and node NBIAS 48 that has a conductance with variation set 2. Variation set 2 refers to the set of variations characterizing driver 2 in FIGS. 2-4, or variations of output current with supply voltage, temperature, and process variation.

FIG. 8 shows part of a circuit that generates PBIAS 58 for an instance of driver 2 discussed previously. In series, the circuit includes supply voltage VDD, circuit 52 which has a conductance with variation set 1, node PBIAS 58, current source Icc 54, and ground 56. Variation set 1 refers to the set of variations characterizing driver 1 in FIGS. 2-4, or variations of output current with supply voltage, temperature, and process variation. In another embodiment, a current source is coupled between VDD and node PBIAS 58, and a circuit is coupled between node PBIAS 58 and ground 56 that has a conductance with variation set 2. Variation set 2 refers to the set of variations characterizing driver 2 in FIGS. 2-4, or variations of output current with supply voltage, temperature, and process variation.

FIG. 9 is a circuit diagram of an example bias circuit that generates the biases for sets of different drivers that at least partly compensate for each other's output variations, including a bias for a set of drivers with n-type transistors, and another bias for a set of drivers with p-type transistors.

Op amp OPA couples the bandgap reference voltage VBGREF 64 into the bias circuit. Op amp OPA has a noninverting input receiving the bandgap reference voltage VBGREF 64. The output 66 of the op amp OPA is coupled to the gate of n-type transistor 68. The op amp OPA has an inverting input coupled to the source of n-type transistor 68.

Resistor R1 73 is coupled between the source of n-type transistor 68 and ground VSS 72. The current through resistor R1 73 is Iref 75. Iref 75=VBGREF/R (in this case R1).

The p-type transistor 72 has a source coupled to supply voltage VDD 70. The p-type transistor 72 also has a gate and a drain coupled together and to the drain of n-type transistor 68. Iref 75 flows through p-type transistor 72.

The p-type transistor MP1 73 performs a current mirror function, and mirrors the current flowing through p-type transistor 72. The p-type transistor MP0 76 also performs a current mirror function, and mirrors the current flowing through p-type transistor 72.

The bias circuit branch with p-type transistor MP0 76 is an example of the circuit of FIG. 7 generating NBIAS. The p-type transistor MP0 76 is in series with node NBIAS 82 coupled to the drain of p-type transistor MP0 76, resistor R2 78, and n-type transistor MNR 80. The n-type transistor MNR 80 has an effective resistance equal to the voltage across the source and drain terminals, divided by the mirrored current flowing through n-type transistor MNR 80.

The n-type transistor MN1 84 has a source coupled to ground VSS 71. The n-type transistor MN1 84 also has a gate and a drain coupled together and to the drain of p-type transistor MP1 74. The same current flows through the series coupled p-type transistor MP1 74 and n-type transistor MN1 84.

The n-type transistor MN0 86 performs a current mirror function, and mirrors the current flowing through n-type transistor MN1 84.

The bias circuit branch with n-type transistor MN0 86 is an example of the circuit of FIG. 8 generating PBIAS. The n-type transistor MN0 86 is in series with node PBIAS 92 coupled to the source of n-type transistor MN0 86, resistor R3 88, and p-type transistor MPR 90. The p-type transistor MPR 80 has an effective resistance equal to the voltage across the source and drain terminals, divided by the mirrored current flowing through p-type transistor MPR 90.

Figure 10:
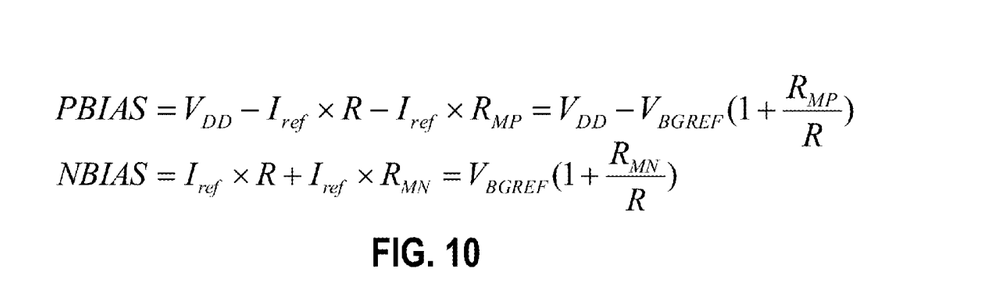
FIG. 10 is a pair of formulas showing the biases generated by the bias circuit of FIG. 9, including a bias for a set of drivers with n-type transistors, and another bias for a set of drivers with p-type transistors.

FIG. 10 is a pair of formulas showing the biases generated by the bias circuit of FIG. 9, including a bias for a set of drivers with n-type transistors, and another bias for a set of drivers with p-type transistors.

In a fast manufacturing process condition resulting in drivers with driving current that is higher than designed, the MOS resistors of transistors MNR and MPR have decreasing resistance. In a slow manufacturing process condition resulting in drivers with driving current that is lower than designed, the MOS resistors of transistors MNR and MPR have increasing resistances Rmn and Rmp. The value of the resistance R is a fixed value. The ratios (Rmn/R) and (Rmp/R) decrease with a fast manufacturing process condition, and increase with a slow manufacturing process condition.

When supply voltage Vdd increases, the ratios (Rmn/R) and (Rmp/R) decrease, and vice versa. When temperature increases, the ratios (Rmn/R) and (Rmp/R) increase, and vice versa.

FIG. 11 a graph contrasting the relative uniformity of output setup time for a circuit with drivers that at least partly compensate for each other's output variations, and the relative nonuniformity of output setup time for a circuit with drivers that fail to compensate for each other's output variations.

The output setup time includes the output voltage rising from 0 to 0.5 VDD, or the output voltage falling from VDD to 0.5 VDD.

Trace 102 shows the output setup time of a circuit without the drive circuits compensated for varying manufacturing and environmental conditions, across 45 different sets of manufacturing and environmental conditions. Trace 102 shows relatively wide variability across the 45 different sets of conditions, ranging between over 6 a.u. to under 3 a.u. The units can be, e.g., microseconds or nanoseconds. The graph emphasizes the low relative difference rather than the absolute quantity.

Trace 104 shows the output setup time of a circuit with the drive circuits compensated for varying manufacturing and environmental conditions, across 45 different sets of manufacturing and environmental conditions. Trace 104 shows relatively narrow variability across the 45 different sets of conditions, ranging between over 6 a.u. to under 4.5 a.u. The units can be, e.g., microseconds or nanoseconds. The graph emphasizes the low relative difference rather than the absolute quantity.

The 45 different sets of conditions are as follows, where the first number indicates supply voltage in volts, the middle notation indicates manufacturing process condition, and the last number indicates temperature in degrees Celsius. In this embodiment, the manufacturing process conditions are:

SS: NMOS with small driving current; PMOS with small driving current.

TT: NMOS with normal driving current; PMOS with normal driving current.

FF: NMOS with large driving current; PMOS with large driving current.

SF: NMOS with small driving current; PMOS with large driving current.

FS: NMOS with large driving current; PMOS with small driving current.

Small means 20% lower than the normal case. Large means 20% larger than the normal case.

2.7/SS/25
2.7/TT/25
2.7/FF/25
2.7/SF/25
2.7/FS/25
2.7/SS/−40
2.7/TT/−40
2.7/FF/−40
2.7/SF/−40
2.7/FS/−40
2.7/SS/125
2.7/TT/125
2.7/FF/125
2.7/SF/125
2.7/FS/125
3/SS/25
3/TT/25
3/FF/25
3/SF/25
3/FS/25
3/SS/−40
3/TT/−40
3/FF/−40
3/SF/−40
3/FS/−40
3/SS/125
3/TT/125
3/FF/125
3/SF/125
3/FS/125
3.6/SS/25
3.6/TT/25
3.6/FF/25
3.6/SF/25
3.6/FS/25
3.6/SS/−40
3.6/TT/−40
3.6/FF/−40
3.6/SF/−40
3.6/FS/−40
3.6/SS/125
3.6/TT/125
3.6/FF/125
3.6/SF/125
3.6/FS/125

Trace 104 shows a variability of roughly half that of trace 102.

Figure 12:
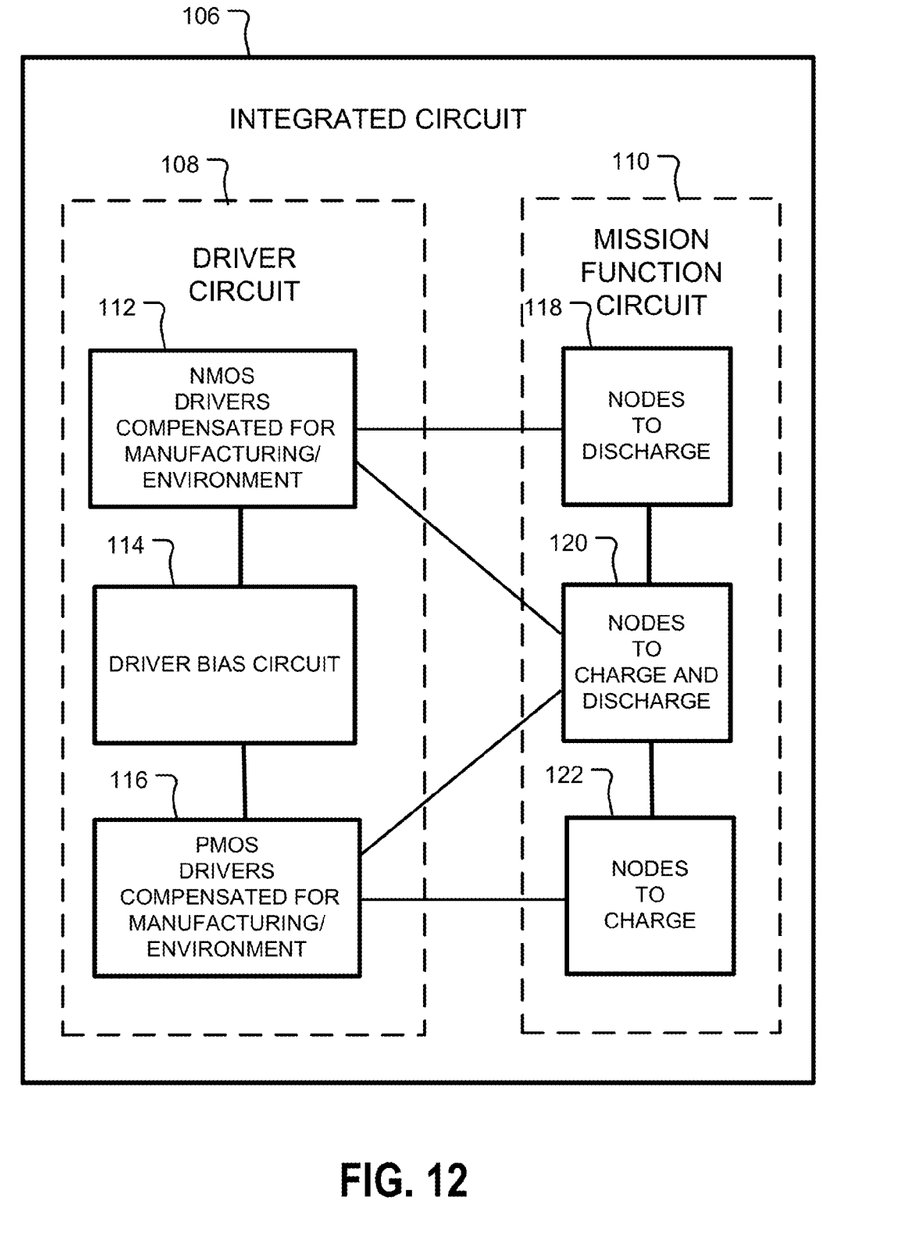
FIG. 12 is a simplified block diagram of an example integrated circuit with a mission function circuit and a corresponding driver circuit with drivers that compensate for varying manufacturing process and environment.

FIG. 12 is a simplified block diagram of an example integrated circuit with a mission function circuit and a corresponding driver circuit with drivers that compensate for varying manufacturing process and environment.

The integrated circuit 106 includes a driver circuit 108 and a mission function circuit 110. The driver circuit 108 includes a driver bias circuit 114 which provides biases to the NMOS drivers 112 compensated for variations in manufacturing and environment, and to the PMOS drivers 116 compensated for variations in manufacturing and environment. The mission function circuit 110 includes nodes to discharge 118, nodes to charge and discharge 120, and nodes to charge 122. The NMOS drivers 112 are coupled to the nodes to discharge 118 and the nodes to charge and discharge 120. The PMOS drivers 116 are coupled to the nodes to charge 122 and the nodes to charge and discharge 120.

Figure 13:
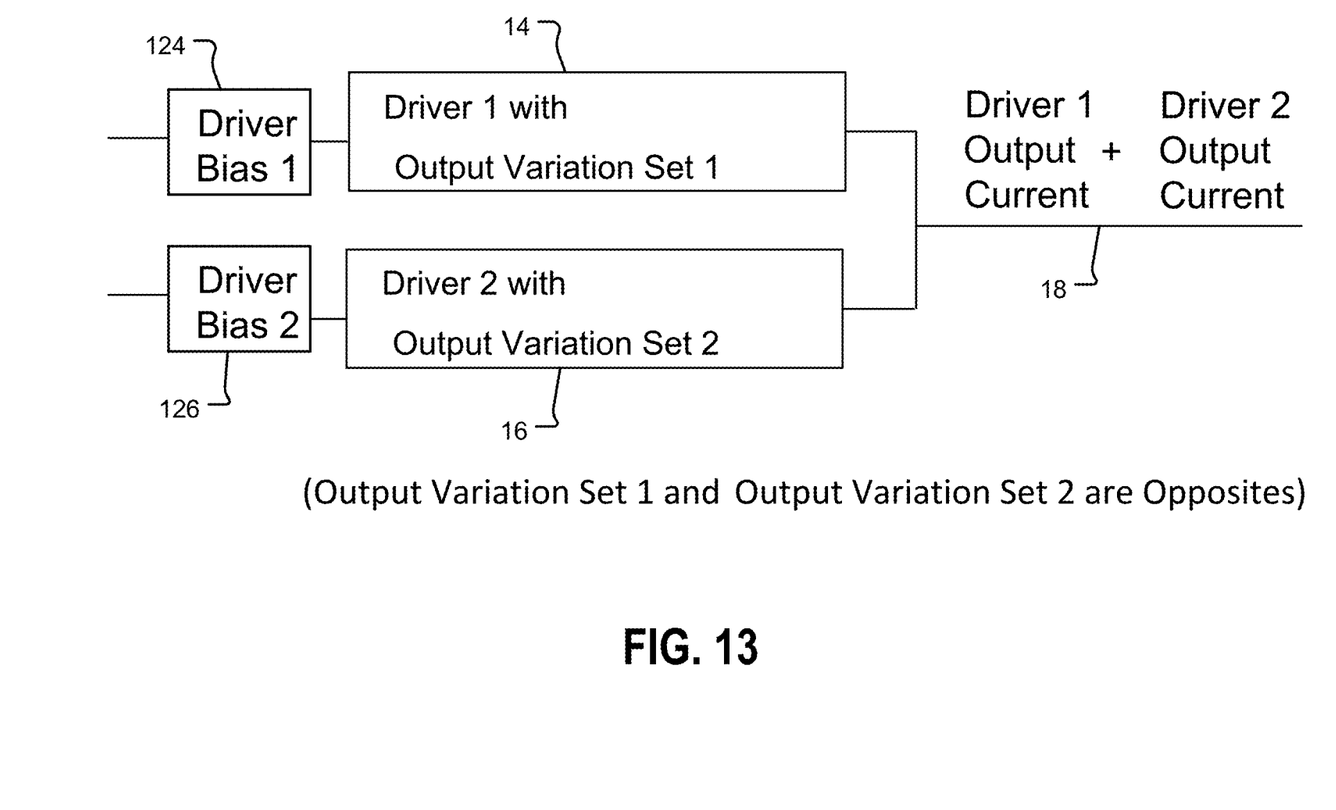
FIG. 13 is a block diagram of a circuit with multiple drivers that have different sets of output variations with manufacturing and environmental variations, as in FIG. 1, but with multiple driver biases.

FIG. 13 is a block diagram of a circuit with multiple drivers that have different sets of output variations with manufacturing and environmental variations, as in FIG. 1, but with multiple driver biases.

In FIG. 1, single driver bias 12 provide biasing signals such as voltages to driver 1 14 and driver 2 16. In FIG. 13, multiple driver biases provide biasing signals such as voltages to driver 1 14 and driver 2 16. Driver bias 124 provide a biasing signal such as voltage to driver 1 14. Driver bias 126 provide a biasing signal such as voltage to driver 2 16. Other parts are described with respect to FIG. 1.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
   a first plurality of current drivers providing current outputs and having a first set of variations with supply voltage, temperature, and fabrication process; and the current outputs at least partly compensate each other for the first set of variations in supply voltage, temperature, and fabrication process.

2. The circuit of claim 1, wherein:
   the first plurality of current drivers include:
     a first current driver with a first n-type transistor having a gate biased with a first supply reference voltage; and
     a second current driver with a second n-type transistor having a gate biased with a first voltage circuit output based on at least one constant voltage reference, and the current outputs of the first current driver and the second current driver at least partly compensate each other for the first set of variations of the current outputs.

3. The circuit of claim 2, wherein
   the at least one constant voltage reference is scaled proportionally with a resistance across source and drain terminals of a transistor.

4. The circuit of claim 1, wherein:
   the first plurality of current drivers include:
     a first current driver with a first p-type transistor having a gate biased with a first supply reference voltage; and
     a second current driver with a second p-type transistor having a gate biased with a first voltage circuit output based on at least one constant voltage reference, and the current outputs of the first current driver and the second current driver at least partly compensate each other for the first set of variations of the current outputs.

5. The circuit of claim 4, wherein
the at least one constant voltage reference is scaled proportionally with a resistance across source and drain terminals of a transistor.

6. The circuit of claim 1, further comprising a second plurality of current drivers providing current outputs coupled together, and the current outputs have a second set of variations with supply voltage, temperature, and fabrication process, and different ones of the current outputs at least partly compensate each other for the second set of variations of the current outputs, wherein:
the first plurality of current drivers include:
a first current driver with a first n-type transistor having a gate biased with a first supply reference voltage; and
a second current driver with a second n-type transistor having a gate biased with a first voltage circuit output based on at least one constant voltage reference;
and
the second plurality of current drivers include:
a third current driver with a first p-type transistor having a gate biased with a second supply reference voltage; and
a fourth current driver with a second p-type transistor having a gate biased with a second voltage circuit output based on at least one constant voltage reference.

7. The circuit of claim 6, wherein
the at least one constant voltage reference is scaled proportionally with a resistance across source and drain terminals of a transistor.

8. The circuit of claim 6, wherein the at least one constant voltage reference includes at least one bandgap reference circuit, and current mirrors make current copies of a current flowing through the at least one bandgap reference circuit, and the at least one constant voltage reference for the first plurality of current drivers and for the second plurality of current drivers being scaled proportionally with resistances across source and drain terminals of transistors.

9. An integrated circuit, comprising:
a bias circuit including:
a first voltage circuit output based on at least one constant voltage reference, the first voltage circuit output biasing at least one of a first plurality of current drivers,
wherein the first plurality of current drivers providing current outputs and having a first set of variations with supply voltage, temperature, and fabrication process, and different ones of the current outputs at least partly compensate each other for the first set of variations of the current outputs.

10. The circuit of claim 9, wherein
the at least one constant voltage reference is scaled proportionally with a resistance across source and drain terminals of a transistor.

11. The circuit of claim 9, wherein the bias circuit further includes:
a second voltage circuit output based on at least one constant voltage reference, the second voltage circuit output biasing at least one of a second plurality of current drivers,
wherein the second plurality of current drivers provide current outputs coupled together and having a second set of variations with supply voltage, temperature, and fabrication process, and different ones of the current outputs at least partly compensate each other for the second set of variations of the current outputs.

12. The circuit of claim 11, wherein
the at least one constant voltage reference is scaled proportionally with a resistance across source and drain terminals of a transistor.

13. The circuit of claim 11, wherein the at least one constant voltage reference includes at least one bandgap reference circuit, and current mirrors make current copies of a current flowing through the at least one bandgap reference circuit, and the at least one constant voltage reference for the first plurality of current drivers and for the second plurality of current drivers being scaled proportionally with resistances across source and drain terminals of transistors.

14. A method, comprising:
providing a first current driver having a first bias source output current;
providing a second current driver having a second bias source output current; and
combining the first and the second bias source output currents to provide a node with an output current independent of supply voltage, temperature, and fabrication process.

15. The method of claim 14, wherein the first current driver is based on p-type transistors, and the second current driver is based on n-type transistors.

16. The method of claim 15, wherein at least one of the p-type transistors and at least one of the n-type transistors have gates biased with at least one constant voltage reference scaled proportionally with resistance across source and drain transistor terminals.

17. A method, comprising:
providing a first current driver powered by a first reference voltage and having a first bias source output current;
providing a second current driver powered by a second reference voltage and having a second bias source output current; and
providing a combined output current from combining the first and the second output currents to a node,
wherein the first and the second reference voltages are different non-zero voltages.

18. The method of claim 17, wherein the first current driver is based on p-type transistors, and the second current driver is based on n-type transistors.

19. The method of claim 17, wherein at least one of the p-type transistors and at least one of the n-type transistors have gates biased with at least one constant voltage reference scaled proportionally with resistance across source and drain transistor terminals.

20. The method of claim 17, wherein the first and the second bias source output compensate each other for variations in supply voltage, temperature, and fabrication process.

* * * * *